United States Patent [19]
Takiguchi et al.

[11] Patent Number: 5,544,188
[45] Date of Patent: Aug. 6, 1996

[54] SEMICONDUCTOR LASER DEVICE HAVING A HIGH EMISSION EFFICIENCY AND A LARGE MODULATION BANDWIDTH

[75] Inventors: Tohru Takiguchi; Katsuhiko Goto, both of Itami, Japan

[73] Assignee: Mitsubishi Denki Kabushiki Kaisha, Tokyo, Japan

[21] Appl. No.: 348,191

[22] Filed: Nov. 28, 1994

[30] Foreign Application Priority Data

Dec. 16, 1993 [JP] Japan .................................. 5-315717

[51] Int. Cl.⁶ .................................................. H01S 3/19
[52] U.S. Cl. ............................................. 372/45; 372/46
[58] Field of Search .............................. 372/45, 43, 46

[56] References Cited

U.S. PATENT DOCUMENTS

| 4,839,899 | 6/1989 | Burnham et al. | 372/45 |
| 5,276,698 | 1/1994 | Yoshida et al. | 372/45 |
| 5,390,205 | 2/1995 | Mori et al. | 372/46 |

FOREIGN PATENT DOCUMENTS

| 582942 | 8/1993 | European Pat. Off. . |
| 63-06686 | 12/1988 | Japan . |
| 2229487 | 9/1990 | Japan . |
| 449688 | 2/1992 | Japan . |
| 2207283 | 6/1988 | United Kingdom . |

OTHER PUBLICATIONS

Nagarajan et al, "High Speed Quantum–Well Lasers And Carrier Transport Effects", IEEE Journal of Quantum Electronics, vol. 28, No. 10, Oct. 1992, pp. 1990–2008.
Ohkura et al, "Low Threshold FS–BH Laser On p–InP Substrate Grown By All–MOCVD", Electronics Letters, vol. 28, No. 19, Sep. 1992, pp. 1844–1845.

Primary Examiner—Rodney B. Bovernick
Assistant Examiner—Yisun Song
Attorney, Agent, or Firm—Leydig, Voit & Mayer

[57] ABSTRACT

A semiconductor laser device includes an active layer having a multiquantum well (MQW) structure including well layers and barrier layers, each well layer being disposed between a pair of barrier layers. In this structure, the barrier layers have respective band gap energies that gradually decrease from a largest value in a central part of the MQW structure toward interfaces of the MQW structure with other layers of the laser and the well layers have respective band gap energies that gradually increase from a smallest value in the central part of the MQW structure toward the interfaces. A semiconductor laser device that produces uniform charge carrier injection, has a high thermal electron emission efficiency, and a broad modulation bandwidth is realized.

16 Claims, 9 Drawing Sheets

5,544,188

SEMICONDUCTOR LASER DEVICE HAVING A HIGH EMISSION EFFICIENCY AND A LARGE MODULATION BANDWIDTH

FIELD OF THE INVENTION

The present invention relates to a semiconductor laser having a high emission efficiency and a large modulation bandwidth.

BACKGROUND OF THE INVENTION

FIG. 1 is a sectional view illustrating a prior art long-wave semiconductor laser device. In FIG. 1, reference numeral 1 designates a p type InP substrate 400 μm thick. A p type InP cladding layer 2 having a dopant concentration of $1\times10^{18} cm^{-3}$ and a thickness of 1 μm is disposed on the p type InP substrate 1. An MQW (multiquantum well) active layer 3 is disposed on the p type InP cladding layer 2. The structure of the active layer 3 will be described later. An n type cladding layer 4 having a dopant concentration of $1\times10^{18}$ $cm^{-3}$ and a thickness of 0.5μm is disposed on the MQW active layer 3. The p type cladding layer 2, the MQW active layer 3, and the n type cladding layer 4 have a mesa shape. A p type InP mesa embedding layer 5 having a dopant concentration of $1\times10^{18}$ $cm^{-3}$ and a thickness of 1 μm is disposed on the p type cladding layer 2, contacting the opposite sides of the mesa. An n type InP current blocking layer 6 and a p type InP current blocking layer 7 are successively disposed on the mesa embedding layer 5. The n type InP current blocking layer 6 and the p type InP current blocking layer 7 have dopant concentrations of $5\times10^{18}$ $cm^{-3}$ and $1\times10^{18}$ $cm^{-3}$, respectively, and a thickness of 1 μm. A p side electrode 8 comprising Ti/Pt/Au is disposed on the rear surface of the substrate 1, and an n side electrode 9 comprising Au/Ge/Ni/Au is disposed on the n type cladding layer 4. An insulating film 10 comprising $SiO_2$ is disposed over the front surface of the structure where the n side electrode 9 is absent.

FIG. 2 is a sectional view showing a part of the laser structure of FIG. 1 in the vicinity of the MQW active layer 3. In FIG. 2, reference numeral 11 designates an InGaAsP light confining layer, numeral 12 designates an InGaAs or InGaAsP well layer, and numeral 13 designates an InGaAsP barrier layer. FIG. 3 is an energy band diagram of the structure shown in FIG. 2.

When current flows between the p side electrode 8 and the n side electrode 9, holes and electrons are injected into the active layer 3 from the p type cladding layer 2 and the n type cladding layer 4, respectively. The injected holes and electrons recombine in the active layer 3, whereby laser oscillation occurs. The holes and the electrons pass through the InGaAsP light confining layer 11 and the InGaAsP barrier layer 13 and are stored in the InGaAs or InGaAsP well layer 12. Then, the holes and the electrons recombine to produce light.

However, the prior art semiconductor laser device has the following drawbacks. When carriers are injected into a plurality of wells and the number of the wells is large, the distribution of the carriers (especially holes) in the wells is uneven, causing an increase in the carrier concentration at the side of the p type cladding layer 2. As a result, light is also unevenly distributed at the side of the p type cladding layer 2, whereby the emission efficiency is lowered. In addition, the distribution of the carriers between the wells causes a difference in pseudo-Fermi level between the wells, so that the gain spectrum is broadened. Consequently, the high speed modulation characteristic of the laser device is limited.

As described above, in the prior art semiconductor laser device having an MQW active layer, since compositions and thicknesses of the barrier layers in the MQW structure are uniform, injection of carriers becomes uneven, so that the emission efficiency is low. As a result, the high speed modulation characteristic is not preferable, and the modulation bandwidth is narrow.

SUMMARY OF THE INVENTION

An object of the present invention is to provide a semiconductor laser that has uniform injection of carriers, a high emission efficiency, and a broad modulation bandwidth.

Other objects and advantages of the present invention will become apparent from the detailed description that follows. The detailed description and specific embodiments described are provided only for illustration since various additions and modifications within the scope of the invention will be apparent to those of skill in the art from the detailed description.

According to a first aspect of the present invention, in a semiconductor laser device including an MQW active layer, the band gap energies of the barrier layers included in the MQW structure are largest in the center of the MQW structure and gradually decrease toward both ends of the MQW structure.

According to a second aspect of the present invention, in a semiconductor laser device having an MQW active layer, the band gap energies of the barrier layers included in the MQW structure are largest in the center of the MQW structure and gradually decrease toward both ends of the MQW structure. Further, the band gap energies of the well layers included in the MQW structure are smallest in the center of the MQW structure and gradually increase toward both ends of the MQW structure.

According to a third aspect of the present invention, in a semiconductor laser device having an MQW active layer, the thicknesses of the barrier layers of the MQW structure are largest in the center of the MQW structure and gradually become smaller toward both ends of the MQW structure.

According to a fourth aspect of the present invention, a semiconductor laser includes an MQW active layer in which a plurality of well layers and a plurality of barrier layers are alternatingly arranged, and the band gap energies of the barrier layers are largest in the center of the MQW structure and gradually decrease toward both ends of the MQW structure. Further, the thicknesses of the barrier layers are largest in the center of the MQW structure and gradually become smaller toward both ends of the MQW structure.

According to a fifth aspect of the present invention, in the semiconductor laser, the band gap energies of the well layers are smallest in the center of the MQW structure and gradually increase toward both ends of the MQW structure.

According to a sixth aspect of the present invention, in a semiconductor laser device having an MQW active layer, the lattice constants of the barrier layers included in the MQW structure are smaller than the lattice constant of the substrate, largest in the center of the MQW structure, and gradually decrease toward both ends of the MQW structure.

According to a seventh aspect of the present invention, in a semiconductor laser device having an MQW active layer, the band gap energies of the barrier layers included in the MQW structure are largest in the center of the MQW structure and gradually decrease toward both ends of the MQW structure. Further, the lattice constants of the barrier layers are smaller than the lattice constant of the substrate.

According to an eighth aspect of the present invention, in a semiconductor laser device having an MQW active layer, the band gap energies of the barrier layers included in the MQW structure are largest in the center of the MQW structure and gradually decrease toward both ends of the MQW structure. Further, the lattice constants of the barrier layers are smaller than the lattice constant of the substrate. Further, the lattice constants of the barrier layers are largest in the center of the MQW structure and gradually decrease toward both ends of the MQW structure.

According to a ninth aspect of the present invention, in a semiconductor laser device having an MQW active layer, the band gap energies of the barrier layers included in the MQW structure are largest in the center of the MQW structure and gradually decrease toward both ends of the MQW structure. Further, the band gap energies of the well layers included in the MQW structure are smallest in the center of the MQW structure and increase toward both ends of the MQW structure. Further, the lattice constants of the barrier layers are smaller than the lattice constant of the substrate, largest in the center of the MQW structure, and decrease toward both ends of the MQW structure.

According to a tenth aspect of the present invention, in a semiconductor laser device including an MOW active layer, the thicknesses of the barrier layers included in the MQW structure are largest in the center of the MQW structure and gradually decrease toward both ends of the MQW structure. Further, the lattice constants of the barrier layers are smaller than the lattice constant of the substrate.

According to an eleventh aspect of the present invention, in a semiconductor laser device having an MQW active layer, the thicknesses of the barrier layers included in the MQW structure are largest in the center of the MQW structure and gradually decrease toward both ends of the MQW structure. Further, the lattice constants of the barrier layers are smaller than the lattice constant of a substrate, are largest in the center of the MQW structure, and gradually decrease toward both ends of the MQW structure According to the present invention, a semiconductor laser has charge carrier injection, a high emission efficiency, and a broad modulation band width

DETAILED DESCRIPTION OF THE PREFERRED EMBODIMENTS

Embodiments 1 and 2

Figure 4:
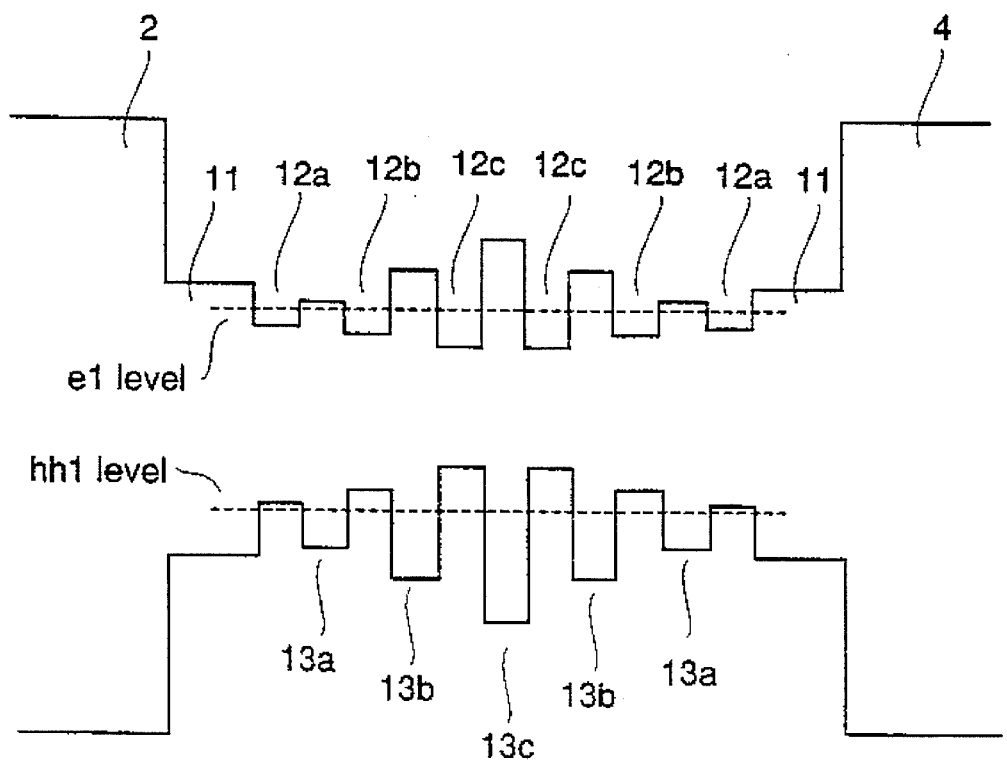
FIGS. 4(a)–4(b) are energy band diagrams of MQW active layers of semiconductor laser devices according to first and second embodiments of the present invention.
Figure 4:
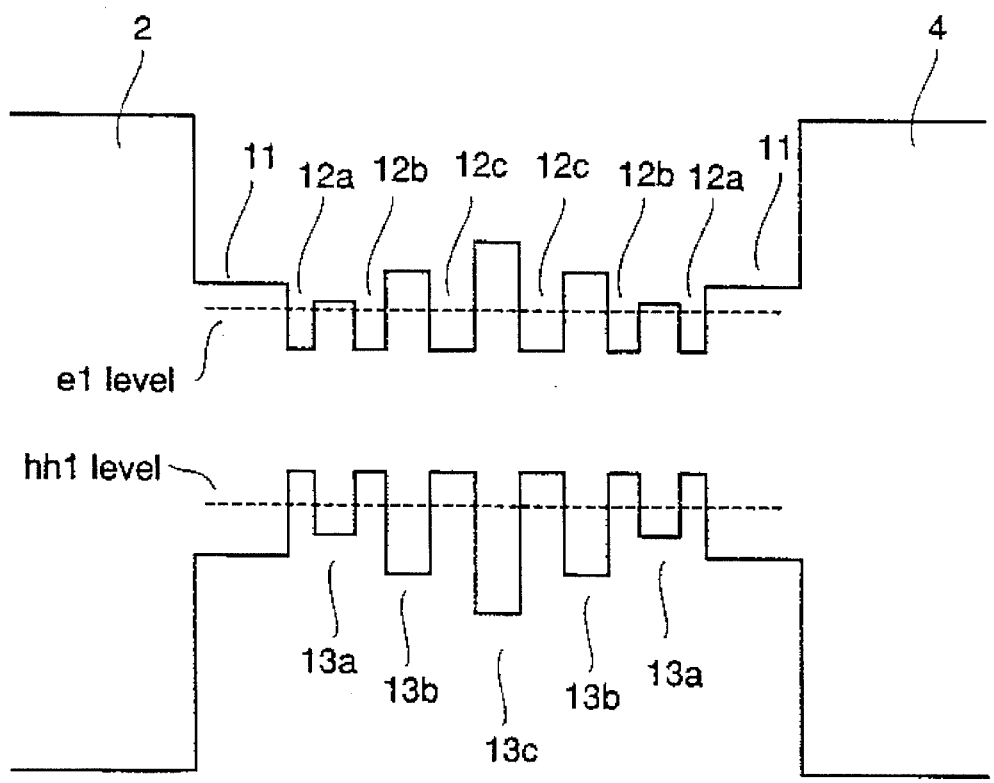

FIGS. 4(a) and 4(b) are energy band diagrams for explaining MQW active layers included in semiconductor laser devices according to first and second embodiments of the present invention. In the first and second embodiments of the invention, the band gap energies of the barrier layers included in the MQW structure are largest in the center of the MQW structure and gradually decrease toward both ends of the MQW structure. In addition, according to the first embodiment of the invention, the band gap energies of the well layers included in the MQW structure are smallest in the center of the MQW structure and gradually increase toward both ends of the MQW structure. According to the second embodiment of the present invention, the thicknesses of the well layers are largest in the center of the MQW structure and gradually decrease toward both ends of the MQW structure.

Figure 3:
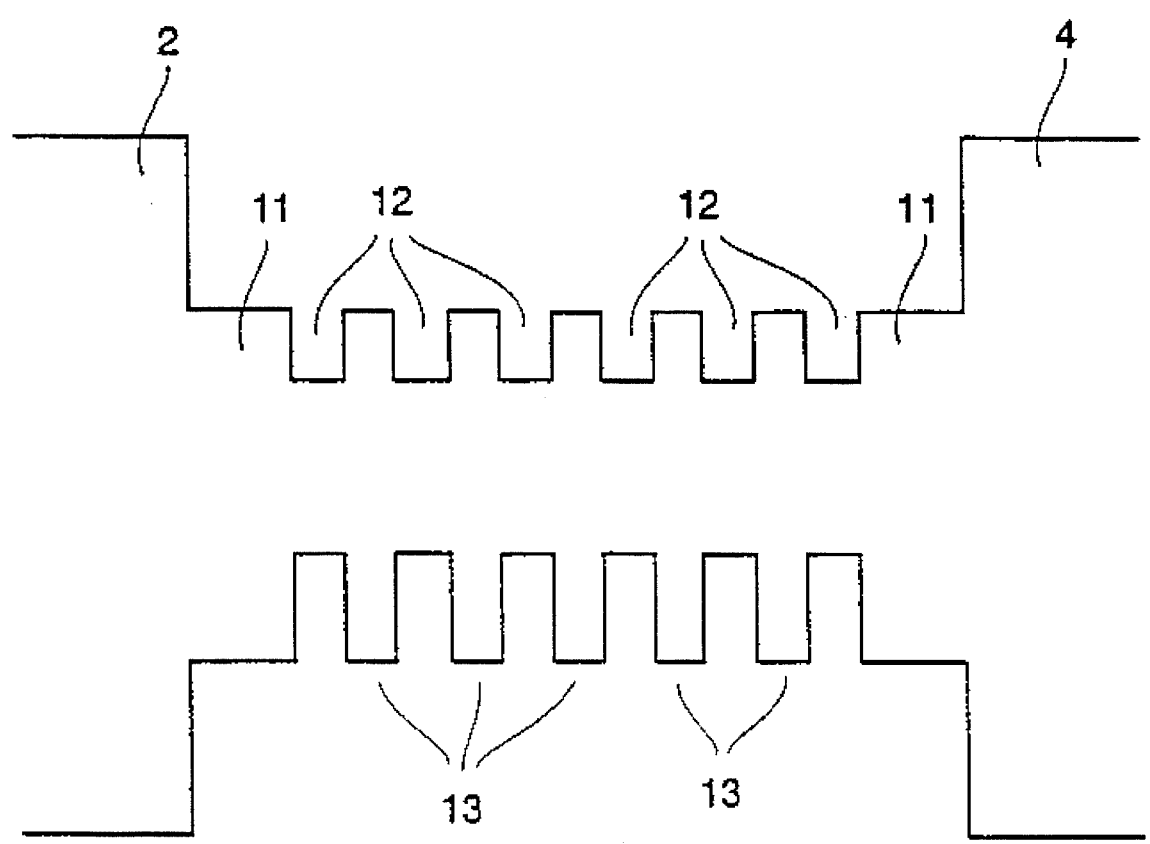
FIG. 3 is an energy band diagram of the structure shown in FIG. 2.

In FIGS. 4(a) and 4(b), the same reference numerals as in FIG. 3 designate the same or corresponding parts, and reference numerals 12a, 12b, and 12c designate InGaAsP well layers, and reference numerals 13a, 13b, and 13c designate InGaAsP barrier layers.

In the first and second embodiments of the present invention, the composition, band gap energy Eg, and thickness of each of the InGaAsP ($In_{1-x}Ga_xAs_yP_{1-y}$) well layers 12a, 12b, and 12c and the InGaAsP ($In_{1-x}Ga_xAs_yP_{1-y}$) barrier layers 13a, 13b, and 13c are as shown in the following tables 1 and 2.

TABLE 1

| | Embodiment 1 | | | |
|---|---|---|---|---|
| Layer | x | y | Eg (eV) | Thickness (Angstrom) |
| 12a | 0.44 | 0.94 | 0.78 | 70 |
| 12b | 0.46 | 0.98 | 0.76 | 70 |
| 12c | 0.47 | 1.0 | 0.74 | 70 |
| 13a | 0.37 | 0.80 | 0.85 | 100 |
| 13b | 0.33 | 0.71 | 0.90 | 100 |
| 13c | 0.29 | 0.62 | 0.95 | 100 |

TABLE 2

| | | Embodiment 2 | | |
|---|---|---|---|---|
| Layer | x | y | Eg (eV) | Thickness (Angstrom) |
| 12a | 0.47 | 1.0 | 0.74 | 30 |
| 12b | 0.47 | 1.0 | 0.74 | 40 |
| 12c | 0.47 | 1.0 | 0.74 | 70 |
| 13a | 0.37 | 0.80 | 0.85 | 100 |
| 13b | 0.33 | 0.71 | 0.90 | 100 |
| 13c | 0.29 | 0.62 | 0.95 | 100 |

In this case, the emission wavelength of the MQW structure is 1.57 μm and the difference between the maximum value and the minimum value of the band gap energy of the barrier layers has to be 0.05 eV or more in order to obtain the effect of these embodiments of the present invention.

As can be seen from tables 1 and 2, according to the first and second embodiments of the present invention, the band gap energies Eg(13a), Eg(13b), and Eg(13c) of the InGaAsP barrier layers 13a, 13b, and 13c, respectively, have a relationship of Eg(13a)<Eg(13b)<Eg(13c).

Figure 5:
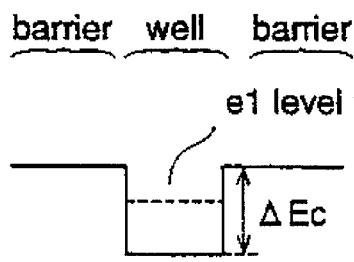
FIG. 5 is an energy band diagram of a quantum well for explaining a principle of the first and second embodiments of the invention.
Figure 5:
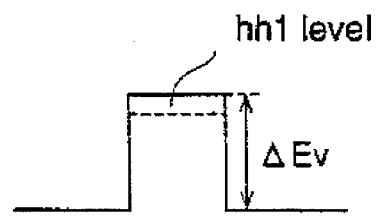

FIG. 5 is an energy band diagram of a quantum well. The emission energy of the quantum well corresponds to an energy difference between an e1 level and an hh1 level. In addition, the emission energy of the quantum well depends on well thickness and the band gap energies of the well and the barrier layers, as shown in the following equations.

$$\tan\left(\frac{m^w Eel t^2}{2\hbar^2}\right)^{1/2} = \left(\frac{m^w(\Delta Ec - Eel)}{m^B Eel}\right)^{1/2}$$

$$\tan\left(\frac{m^w Ehhl t^2}{2\hbar^2}\right)^{1/2} = \left(\frac{m^w(\Delta Ev - Ehhl)}{m^B Ehhl}\right)^{1/2}$$

$$E = Eel + Ehhl + EB$$
$$\Delta Ec + \Delta Ev = \Delta Eg (= EB - EW)$$

where
Eel is the energy level of an electron,
Ehhl is the energy level of a hole,
EW is the band gap energy of a well layer,
EB is the band gap energy of a barrier layer,
ΔEc is the potential barrier confining electrons,
ΔEv is the potential barrier confining holes,
E is the emission energy of a quantum well,
$m^w$ is the effective mass of a well layer,
$m^B$ is the effective mass of a hole in a barrier layer,
t is the thickness of the well layer,
  is Planck's constant ×½.

Therefore, the emission energy E of the quantum well becomes smaller as the thickness t of the well layer is increased, as the band gap EW of the well layer is decreased, and as the band gap EB of the barrier layer is decreased.

According to the first and second embodiments of the present invention, since there is the relationship, of Eg(13a)<Eg(13b)<Eg(13c), in order to equalize the emission energy of each of the well layers 12a, 12b, and 12c, as shown in tables 1 and 2, according to embodiment 1, the relationship between the band gap energies Eg(12a), Eg(12b), and Eg(12c) of the well layers is Eg(12a)>Eg(12b)>Eg(12c). According to embodiment 2, the relationship between the thicknesses t(12a), t(12b), and t(12c) of the well layers is t(12a)<t(12b)<t(12c).

When carriers are injected to the MQW structure, the holes and electrons move in the quantum wells due to three different mechanisms, i.e., tunneling through the barriers, diffusion beyond the barriers, and emission of thermal electrons.

Figure 1:
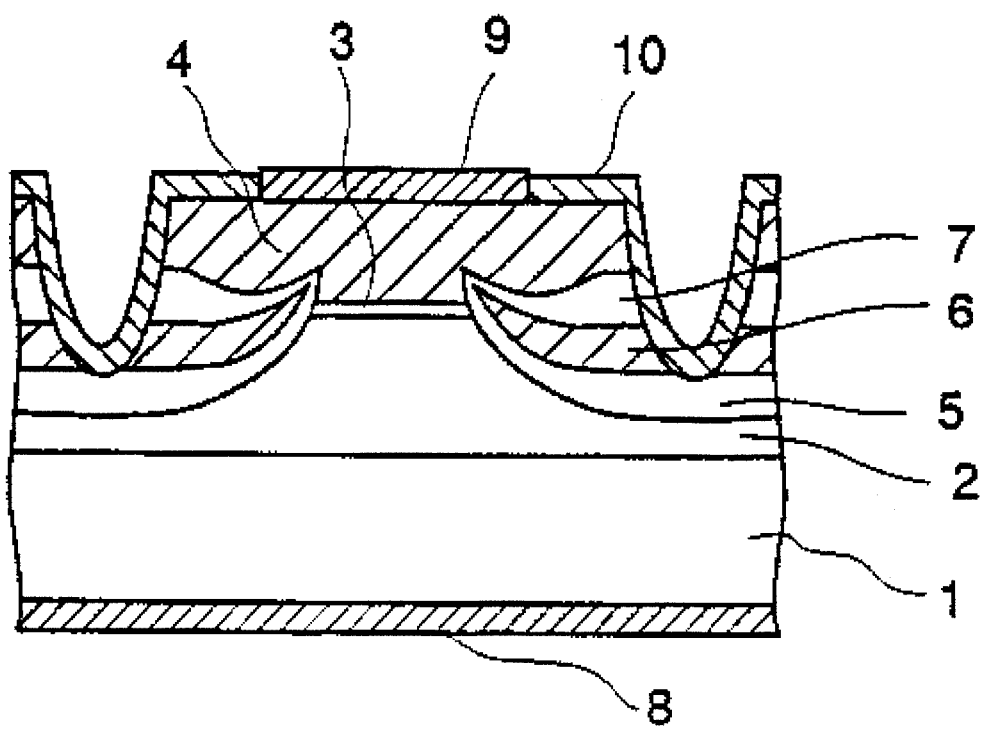
FIG. 1 is a sectional view illustrating a long-wave semiconductor laser device.

According to the prior art structure shown in FIG. 1, when the number of quantum wells is especially large, the carriers (especially holes) move in the quantum wells and recombine with electrons to emit light before being uniformly distributed and are unevenly distributed on the side of the p type cladding layer because the velocity of the holes is lower than the velocity of electrons.

The tunneling time Tt through a barrier is calculated from the following equation.

$$Tt = \frac{h}{2} \times \frac{m^B Lw^2(1 + GLw)}{\hbar^2 \exp(-GLB)} \quad (1)$$

$$G = \left(\frac{8\pi^2 m^B Eb}{h^2}\right)^{1/2} \quad (2)$$

The thermal electron emission time Te is calculated from by the following equation.

$$Te = \left(\frac{2\pi m^w Lw^2}{hBT}\right)^{1/2} \exp\left(\frac{Eb}{hBT}\right) \quad (3)$$

where h is Planck's constant, $m^B$ and $m_W$ are effective masses of holes in the barrier layer and the well layer, respectively, LB is the thickness of the barrier layer, Lw is the thickness of the well layer, EB is an effective barrier height, B is Boltzmann's constant, and T is absolute temperature.

Therefore, the tunneling time Tt can be shortened when the effective barrier height EB is lowered the thickness LB of the barrier layer is decreased, and the effective hole mass $m^B$ in the barrier layer is decreased. In addition, the thermal electron emission time Te can be shortened when the effective barrier height EB is lowered.

Therefore, according to the first embodiment of the present invention, since the band gap energy of the barrier layer 13 at the side of the p type cladding layer 2 is small, the effective barrier height EB is lowered and the tunneling time Tt and the thermal electron emission time Te are shortened, so that the carrier speed is increased and the carriers can be distributed to the well layer 12 on the side of the n type cladding layer 4. In addition, when the band gap energy of the barrier layer 13 at the side of the n type cladding layer 4 is also decreased, the carriers are distributed to the well layer 12 on the side of the n type cladding layer 4.

Therefore, according to the first embodiment of the present invention, since the band gap energies of the barrier layers 13 are largest in the center of the MQW structure and the energies gradually decrease toward both ends of the MQW structure, carriers are uniformly distributed. If the carrier distribution is uniform, the emission efficiency is increased and the modulation bandwidth for high speed modulation is increased. However, when the band gap energies of the barrier layers in the MQW layer uniformly decrease, carriers overflow and the modulation bandwidth for high speed modulation is narrowed.

Japanese Published Patent Application No. Hei. 2-229487 discloses a multi-quantum well semiconductor light emission device having an MQW active layer in which the thicknesses of the well layers included in the active layer gradually increase from the vicinity of the cladding layer at both ends of the active layer toward the center of the active layer, whereby carriers are uniformly injected. Although the purpose of uniform carrier injection is attained by changing the thicknesses of the well layers according to that publication, the same purpose is attained by changing the thicknesses of the barrier layers according to the present invention.

In addition, Japanese Published Patent Application No. Sho. 63-306686 discloses an MQW structure of a semiconductor laser device in which the thickness of the well layers is uniform and the barrier layer thicknesses are smallest in the center of the active layer and gradually increase toward the interface with the cladding layer. The layers are disordered to increase light converging efficiency. Thus, this structure is opposite to the present invention in which the barrier layer thicknesses are largest in the center of the MQW structure and gradually decrease toward both ends. Consequently, while the light converging efficiency is increased but the high speed modulation property is lowered in the device described in the published application, the high speed modulation property is improved but the light converging property is degraded in the present invention.

As described above, in a semiconductor laser device according to the first embodiment of the present invention, since the band gap energies of the barrier layers are largest in the center of the MQW structure and gradually decrease in energy toward both ends of the MQW structure, carriers are uniformly distributed, whereby emission efficiency is improved and the modulation bandwidth for high speed modulation is increased.

Embodiment 3

Figure 2:
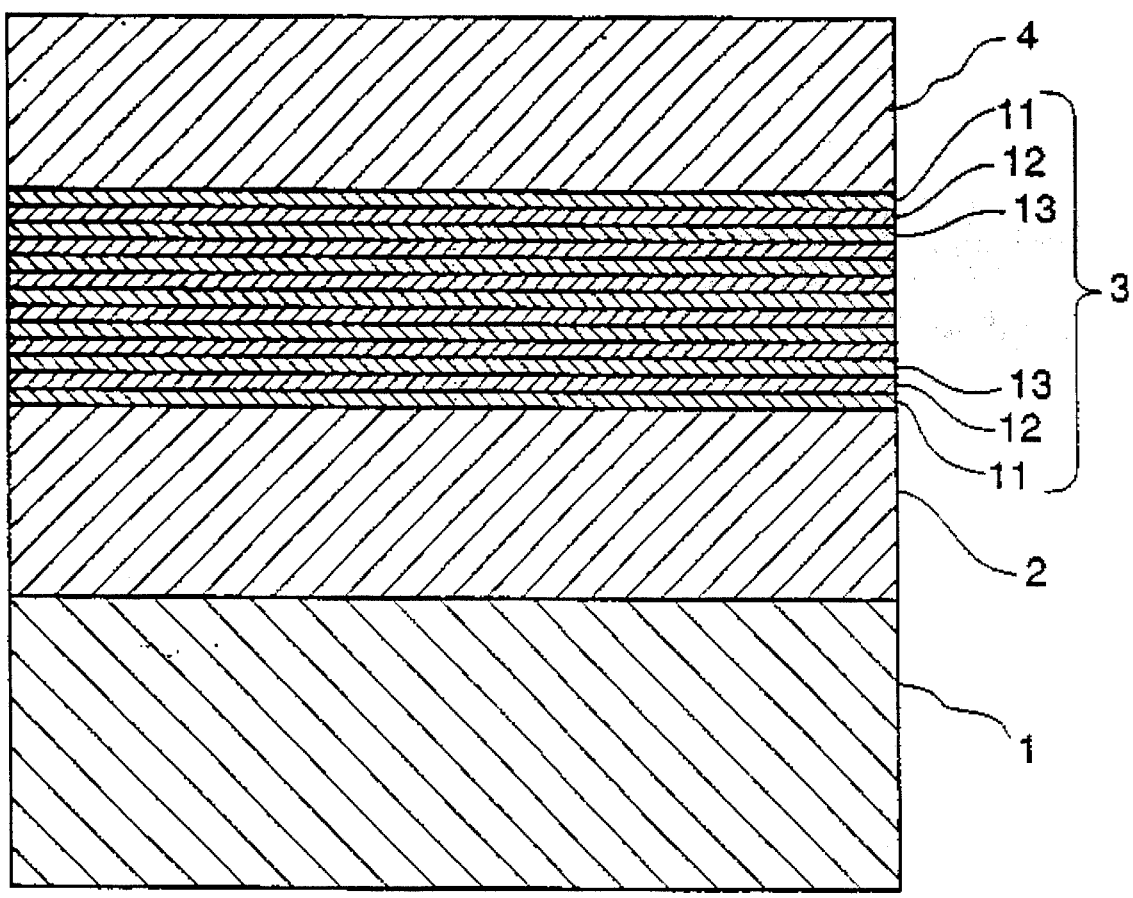
FIG. 2 is a sectional view illustrating a part of the semiconductor laser device of FIG. 1 in the vicinity of an active layer.
Figure 6:
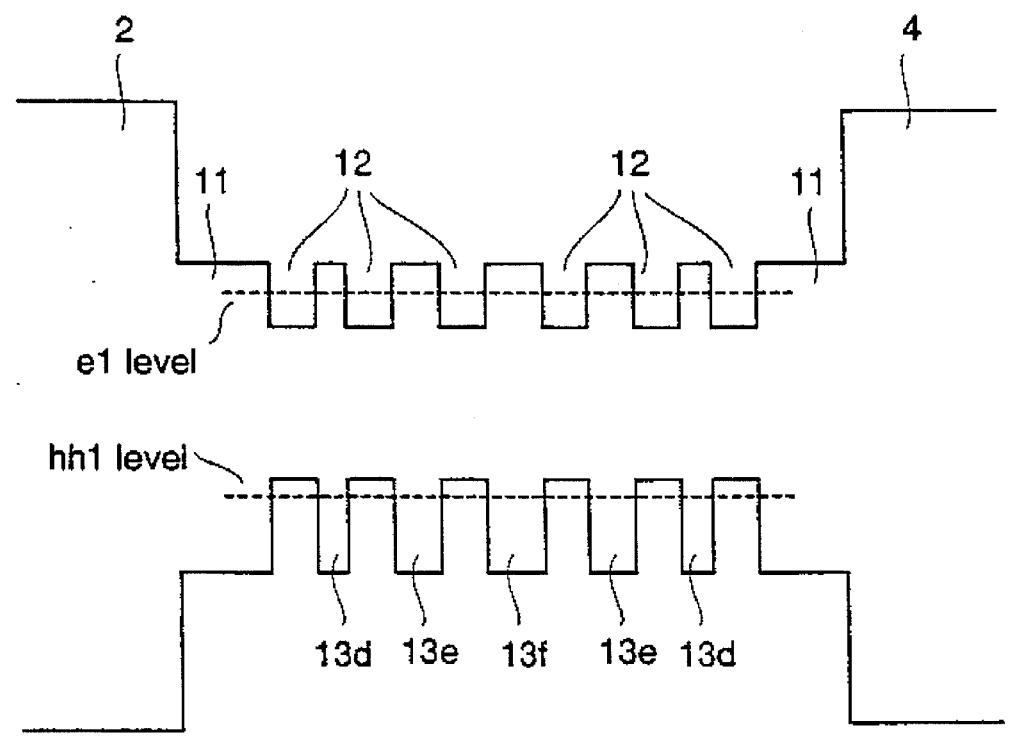
FIG. 6 is an energy band diagram of an MQW active layer of a semiconductor laser device according to a third embodiment of the present invention.

FIG. 6, a diagram for explaining a semiconductor laser device according to a third embodiment of the present invention, is an energy band diagram of an MQW active layer included in the semiconductor device. Although the overall structure of the semiconductor laser device of the third embodiment is the same as the prior art device shown in FIGS. 1 and 2, the barrier layer thicknesses are largest in the center of the MQW structure and gradually decrease toward both ends of the MQW structure in the third embodiment of the present invention.

Referring to FIG. 6, the same reference numerals as in FIG. 3 designate the same or corresponding parts. In addition, reference numeral 12a designates an InGaAsP ($In_{1-x}Ga_xAs_yP_{1-y}$) well layer, and reference numerals 13d, 13e, and 13f designate InGaAsP ($In_{1-x}Ga_xAs_yP_{1-y}$) barrier layers. The composition and thickness of each layer is shown in the following table 3.

TABLE 3

Embodiment 3

|     | x    | y    | Eg (eV) | Thickness (Angstrom) |
|-----|------|------|---------|----------------------|
| 12  | 0.47 | 1.0  | 0.74    | 70                   |
| 13d | 0.29 | 0.62 | 0.95    | 30                   |
| 13e | 0.29 | 0.62 | 0.95    | 60                   |
| 13f | 0.29 | 0.62 | 0.95    | 100                  |

In this case, the difference between the maximum value and the minimum value of the thicknesses of the barrier layers has to be 50 Angstroms or more.

As shown in the above equation (1), as the thickness LB of the barrier layer 13 is decreased, the tunneling time Tt is shortened. Therefore, according to the third embodiment of the present invention, since the thickness of the barrier layer 13 at the side of the p type cladding layer 2 is small, the tunneling time Tt is short, and the velocity of the carriers is increased, whereby the carriers can be distributed to the well layer 12 at the side of the n type cladding layer 4. In addition, when the thickness of the barrier layer 13 on the side of the n type cladding layer 4 is decreased, the carriers can be distributed to the well layer 12 at the side of the n type cladding layer 4.

Thus, according to the third embodiment of the present invention, since the thickness of the barrier layers 13 are largest in the center of the MQW structure and gradually decrease in thickness toward both ends of the MQW structure, carriers can be uniformly distributed. Consequently, emission efficiency is improved and the modulation bandwidth for high speed modulation is increased. In this case, when the thickness of the MQW layer 3 is uniformly decreased, a mini band is formed and the spectrum linewidth is increased.

Thus, in a semiconductor laser device according to the third embodiment of the present invention, since the thickness of the barrier layer 13 at the side of the p type cladding layer 2 is small, the tunneling time Tt in that part is shortened, and the velocity of the carriers is increased. Thereby the carriers are distributed to the well layer 12 on the side of the n type cladding layer 4, and the carriers are uniformly distributed. Thus, emission efficiency is improved and modulation bandwidth for high speed modulation is increased.

Embodiment 4

Figure 7:
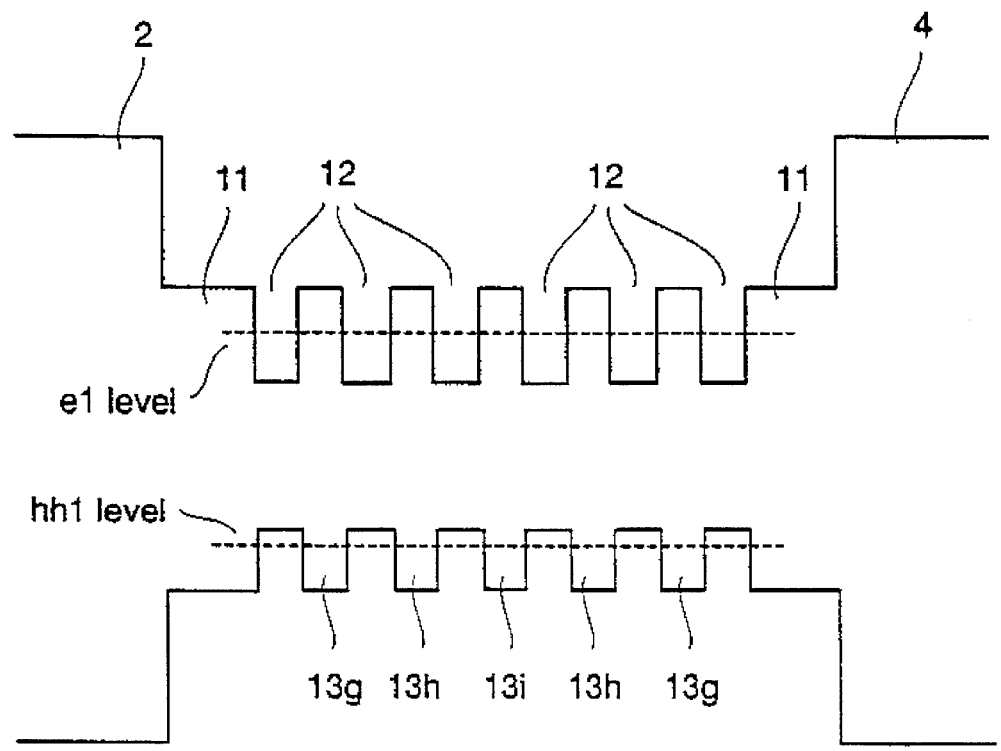
FIG. 7 is an energy band diagram of an MQW active layer of a semiconductor laser device according to a fourth embodiment of the present invention.

FIG. 7 is an energy band diagram of an MQW active layer of a semiconductor laser device according to a fourth embodiment of the present invention. Although the overall structure of the semiconductor laser device of the fourth embodiment of the present invention is the same as the prior art device shown in FIGS. 1 and 2, according to this fourth embodiment, the lattice constants of the barrier layers included in the MQW structure are smaller than that of the substrate, are largest in the center of the MQW structure, and gradually decrease toward both ends of the MQW structure.

Referring to FIG. 7, the same reference numerals as in FIG. 3 designate the same or corresponding parts, and reference numerals 13g, 13h, and 13i designate InGaAsP barrier layers. The composition, band gap energy, layer thickness, and lattice constant of each of the InGaAsP ($In_{1-x}Ga_xAs_yP_{1-y}$) well layers 12 and the InGaAsP ($In_{1-x}Ga_xAs_yP_{1-y}$) barrier layers 13g, 13h, and 13i are as shown in the following table 4.

In this case, strains of the barrier layers 13g, 13h, and 13i are 0.8%, 0.6% and 0.4%, respectively. The difference between the maximum and minimum values of the lattice constants of the barrier layers has to be 0.02 Angstroms or more in order to obtain the effect of this embodiment of the present invention.

TABLE 4

Embodiment 4

|     | x    | y    | Eg (eV) | Thickness (angstrom) | Lattice Constant (angstrom) |
|-----|------|------|---------|----------------------|------------------------------|
| 12  | 0.47 | 1.0  | 0.74    | 70                   | 5.8696                       |
| 13g | 0.51 | 0.85 | 0.95    | 100                  | 5.8226                       |
| 13h | 0.42 | 0.76 | 0.95    | 100                  | 5.8403                       |
| 13i | 0.34 | 0.68 | 0.95    | 100                  | 5.8580                       |

Figure 8:
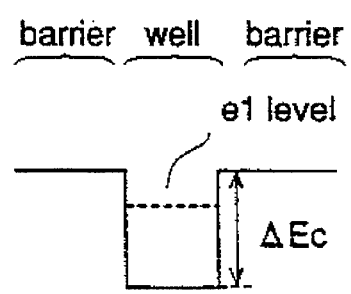
FIG. 8 is an energy band view of a quantum well for explaining the principle of the fourth embodiment of the invention.
Figure 8:
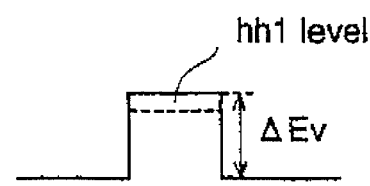

The principle of the fourth embodiment of the present invention is described referring to FIG. 8. When a thin film having a lattice constant smaller than that of a semiconductor substrate is grown on the substrate, a biaxial tensile strain is generated in the thin film. When the tensile strain is added to the thin film, the effective mass of holes in the thin film is reduced. Therefore, when the tensile strain is added to the barrier layer 13, as shown in the equation (1), the tunneling time Tt through the barrier layer 13 is reduced.

In addition, when the tensile strain is added to the barrier layer 13, as shown in FIG. 8, a potential ΔEc for confining electrons is increased, a potential ΔEv for confining holes is decreased, and a barrier height EB is decreased as shown by the equations (1) and (3). As a result, the tunneling time Tt through the barrier layer 13 and the thermal electron emission time Te are shortened.

In addition, as the tensile strain of the barrier layer 13 is increased, the two effects become larger so that the velocity of the carriers is increased. A structure in which a tensile strain is introduced into a barrier layer in order to reduce uneven carrier injection into each well layer, whereby the effective mass of the holes moving in the layer thickness direction is reduced and the diffusion speed is increased, is described in "SCH-improvement Of Efficiency By Introducing Tensile Strain Into Barrier Layers Of MQW Laser-Theory", 1993, Spring Proceedings of the Fortieth Conference of Applied Physics, 31p-C-6.

According to the fourth embodiment of the present invention, since the tensile strain of the barrier layer 13 on the side of the p type cladding layer 2 is large, the effective mass of holes is decreased and the effective barrier height EB is decreased, whereby the tunneling time Tt and the thermal electron emission time Te are shortened and the velocity of the carriers is increased. Consequently, the carriers are distributed to the well layer 12 at the side of the n type cladding layer 4. Thus, the carrier distribution becomes uniform, the emission efficiency is improved, and the modulation bandwidth for high speed modulation is increased.

In addition, according to this embodiment, since the holes take more time to reach the well layer 12 at the side of the n type cladding layer 4, when the tensile strain of the barrier layer 13 at the side of the n type cladding layer 4 is increased, the carriers are uniformly distributed to the well layer 12 at the side of the n type cladding layer 4. Consequently, the carrier distribution becomes uniform and the emission efficiency is improved, whereby the modulation bandwidth for high speed modulation is increased.

Figure 11:
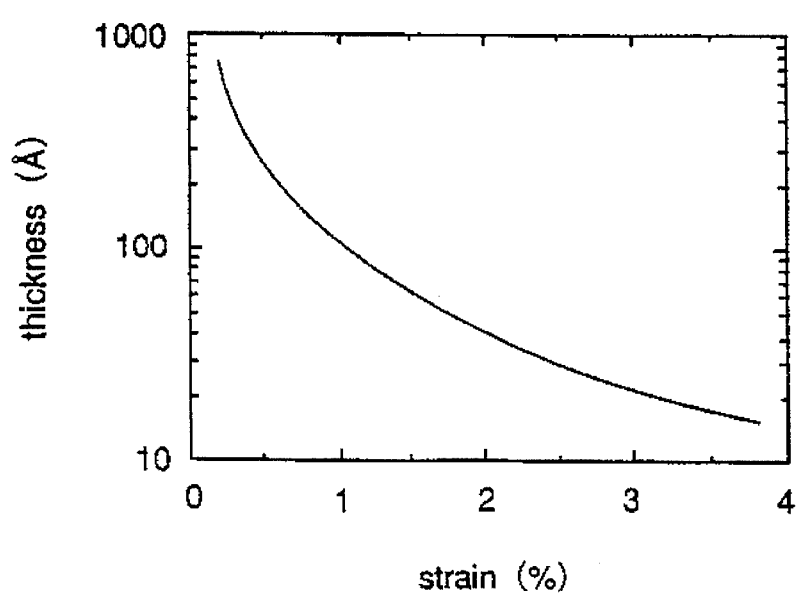
FIG. 11 is a critical film thickness curve showing a relationship between tensile strain and thickness of a barrier layer of an MQW structure.

However, when the tensile strain of the barrier layer 13 of the MQW layer 3 is uniformly increased, defects are introduced when a critical thickness of the barrier layer 13 is exceeded, as shown in FIG. 11, causing the laser characteristic to be degraded.

In a semiconductor laser device according to the fourth embodiment of the present invention, since the lattice constants of the barrier layers 13 are smaller than that of the substrate, are largest in the center of the MQW structure, and gradually decrease toward both ends of the MQW structure, carrier distribution in the MQW active layer becomes uniform and emission efficiency is improved, whereby the modulation bandwidth for high speed modulation is increased.

Embodiments 5 and 6

FIGS. 9(a) and 9(b), diagrams for explaining semiconductor laser devices according to the fifth and sixth embodiments, are energy band diagrams of MQW active layers included in the semiconductor laser device. Although the overall structures of the semiconductor laser devices according to the fifth and sixth embodiments of the present invention are the same as the structure shown in FIGS. 1 and 2, in the semiconductor laser devices according to the fifth and sixth embodiments, the band gap energies of the barrier layers are largest in the center of the MQW structure and gradually decrease toward both ends of the MQW structure, and the lattice constants of the barrier layers are smaller than that of the substrate. In addition, according to the fifth embodiment, the band gap energies of the well layers are smallest in the center of the MQW structure and gradually increase toward both ends of the MOW structure. According to the sixth embodiment, the well layer thicknesses are largest in the center of the MQW structure and gradually decrease toward both ends of the MQW structure.

Figure 9:
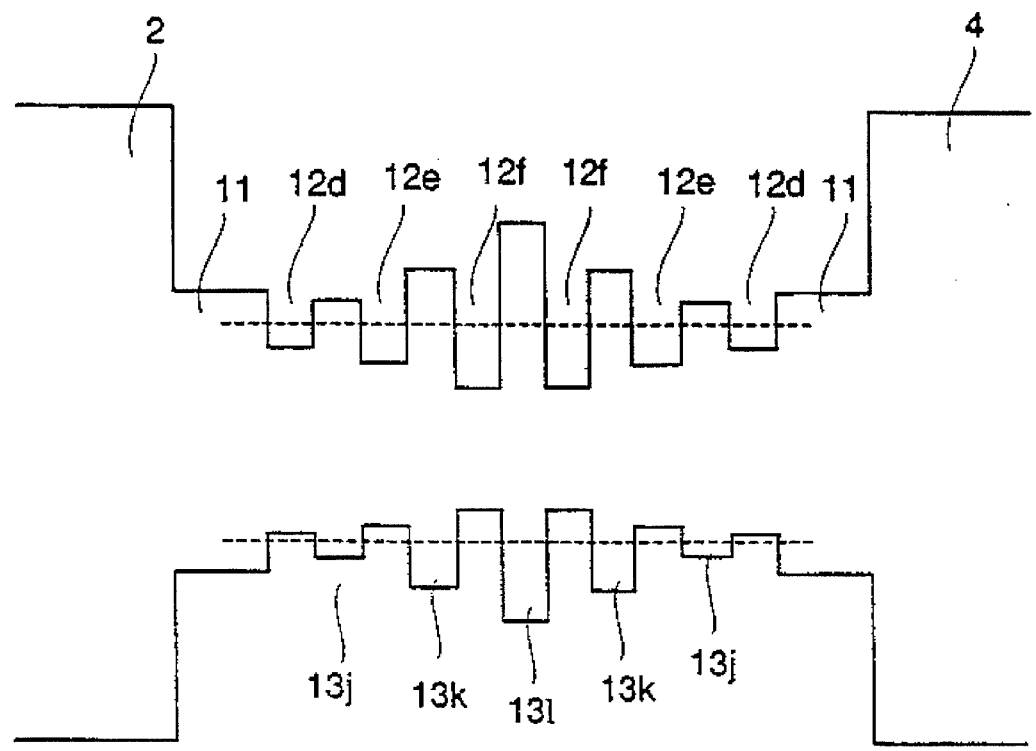
FIGS. 9(a)–9(b) are energy band diagrams of MQW active layers of semiconductor laser devices according to fifth and sixth embodiments of the present invention.
Figure 9:
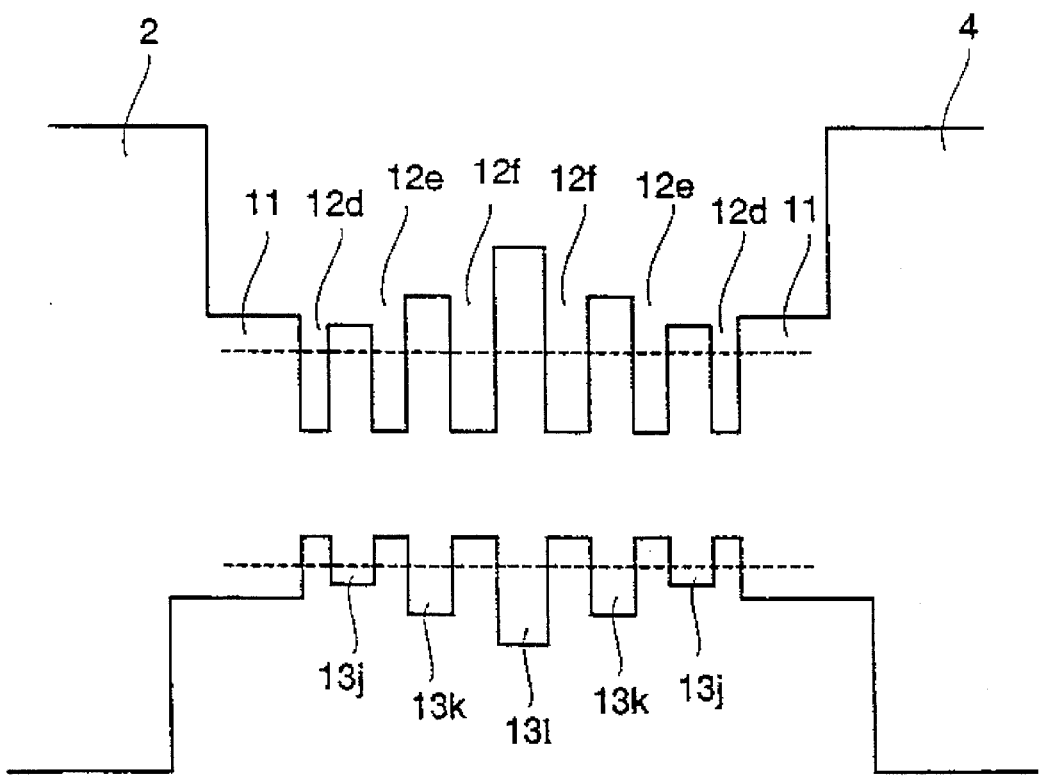

Referring to FIG. 9, the same reference numerals as in FIG. 3 designate the same or corresponding parts, and reference numerals 12d, 12e, and 12f designate InGaAsP ($In_{1-x}Ga_xAs_yP_{1-y}$) well layers and reference numerals 13j, 13k, and 13l designate InGaAsP ($In_{1-x}Ga_xAs_yP_{1-y}$) barrier layers. The composition, energy band gap, lattice constant, and layer thickness of each layer are shown in the following tables 5 and 6.

TABLE 5

| | Embodiment 5 | | | | |
|---|---|---|---|---|---|
| | x | y | Eg (eV) | Thickness (angstrom) | Lattice Constant (angstrom) |
| 12d | 0.44 | 0.94 | 0.78 | 70 | 5.8696 |
| 12e | 0.46 | 0.98 | 0.76 | 70 | 5.8696 |
| 12f | 0.47 | 1.0 | 0.74 | 70 | 5.8696 |
| 13j | 0.52 | 0.95 | 0.85 | 100 | 5.8403 |
| 13k | 0.47 | 1.85 | 0.90 | 100 | 5.8403 |
| 13l | 0.42 | 0.76 | 0.95 | 100 | 5.8403 |

More specifically, according to the fifth and sixth embodiments, the band gap energies Eg(13j), Eg(13k), and Eg(13l) of the InGaAsP barrier layers 13j, 13k, and 13l, respectively, have a relationship of Eg(13j)<Eg(13k)<Eg(13l) like the first embodiment, and lattice constants of the InGaAsP barrier layers 13g, 13h, and 13i are smaller than that of the substrate. In addition, since there is the relationship of Eg(13j)<Eg(13k)<Eg(13l), in

TABLE 6

| | Embodiment 6 | | | | |
|---|---|---|---|---|---|
| | x | y | Eg (eV) | Thickness (angstrom) | Lattice Constant (angstrom) |
| 12d | 0.47 | 1.0 | 0.74 | 30 | 5.8696 |
| 12e | 0.47 | 1.0 | 0.74 | 40 | 5.8696 |
| 12f | 0.47 | 1.0 | 0.74 | 70 | 5.8696 |
| 13j | 0.52 | 0.95 | 0.85 | 100 | 5.8403 |
| 13k | 0.47 | 0.85 | 0.90 | 100 | 5.8403 |
| 13l | 0.42 | 0.76 | 0.95 | 100 | 5.8403 | order to equalize the emission energies of the well layers 12d, 12e, and 12f, the band gap energies Eg(12d), Eg(12e), and Eg(12f) of the well layers must have a relationship of Eg(12d)>Eg(12e)>Eg(12f) (embodiment 5), or the thicknesses t(12d), t(12e), and t(12f) of the well layers must have a relationship of t(12d)<t(12e)<t(12f) (embodiment 6).

According to the fifth and sixth embodiments, first, as described in the first embodiment of the present invention, since the band gap energies of the barrier layers 13 are largest in the center of the MQW structure and gradually decrease toward both ends of the MQW structure, carriers are uniformly distributed.

Second, according to the fifth and sixth embodiments of the present invention, since the lattice constants of the barrier layers 13 are smaller than that of the substrate, tensile strain is added to the barrier layers 13, and, as described in the fourth embodiment, the effective mass of the holes in the barrier layers 13 is reduced and the potential for confining the holes is reduced, whereby carriers in the MQW layer are uniformly distributed.

As described above, in a semiconductor laser device according to the fifth and sixth embodiments of the present invention, because of the two described effects, carriers in the MQW layer are uniformly distributed and a laser having a wide modulation bandwidth for high speed modulation is obtained.

Embodiment 7

Figure 10:
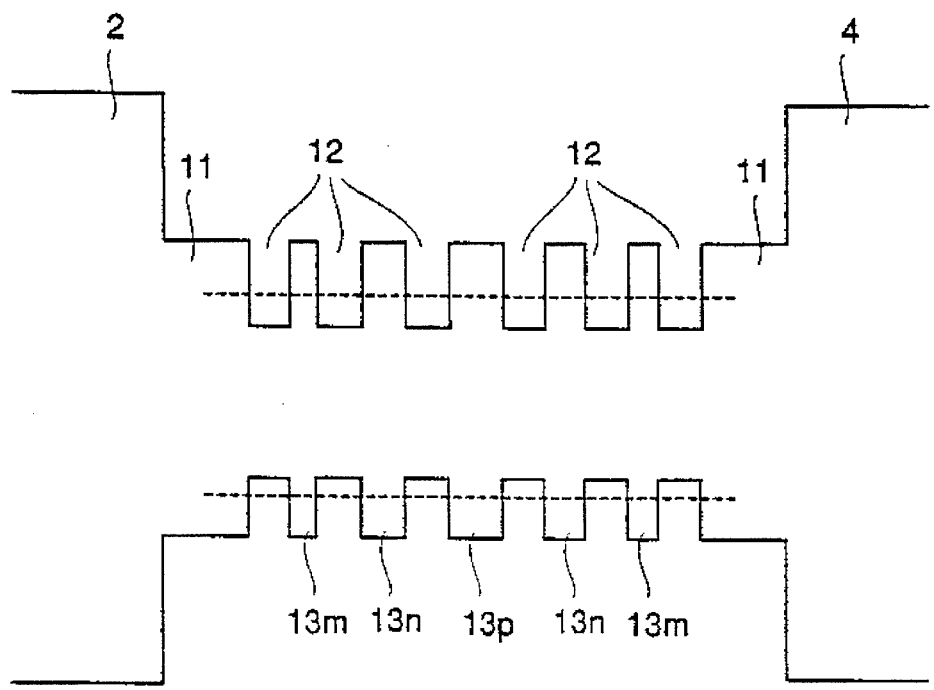
FIG. 10 is an energy band diagram of an MQW active layer of a semiconductor laser device according to a seventh embodiment of the present invention.

FIG. 10, a diagram for explaining a semiconductor laser device according to a seventh embodiment of the present invention, is an energy band diagram of an MQW active layer included in the semiconductor laser device. Although the overall structure of the semiconductor laser device of the seventh embodiment is the same as the devices shown in FIGS. 1 and 2, according to this seventh embodiment of the present invention, the barrier layer thicknesses are largest in the center of the MQW structure and gradually decrease toward both ends of the MQW structure, and the lattice constants of the barrier layers are smaller than that of the substrate.

Referring to FIG. 10, the same reference numerals as in FIG. 3 designate the same or corresponding parts. In addition, reference numeral 12 designates an InGaAsP well layer, and reference numerals 13m, 13n, 13p designate InGaAsP barrier layers. The composition, energy band gap, thickness, and lattice constant of each of these layers are as shown in the following table 7.

TABLE 7

Embodiment 7

| | x | y | Eg (eV) | Thickness (angstrom) | Lattice Constant (angstrom) |
|---|---|---|---|---|---|
| 12 | 0.47 | 1.0 | 0.74 | 70 | 5.8696 |
| 13m | 0.42 | 0.76 | 0.95 | 30 | 5.8403 |
| 13n | 0.42 | 0.76 | 0.95 | 60 | 5.8403 |
| 13p | 0.42 | 0.76 | 0.95 | 100 | 5.8403 |

In this case, the number of wells of the seventh embodiment of the present invention is six or more (normally 20 or less).

According to the seventh embodiment of the present invention, the thicknesses t(13m), t(13n), and t(13p) of the InGaAsP barrier layers 13m, 13n, and 13p have a relationship of t(13m)<t(13n)<t(13p) as in the second embodiment of the present invention, and the lattice constant of each of the InGaAsP barrier layers 13m, 13n, and 13p is smaller than that of the substrate 1. According to the seventh embodiment, first, as described in the third embodiment, the barrier layer thicknesses are largest in the center of the MQW structure and gradually decrease toward both ends of the MQW structure, whereby carriers are uniformly distributed.

According to the seventh embodiment, as described for the fourth embodiment, since the lattice constants of the barrier layers are smaller than that of the substrate, a tensile strain is added to the barrier layers 13. Thus, as described in the fifth and sixth embodiments of the present invention, the effective mass of holes in the barrier layers 13 is reduced and the potential for confining holes is reduced, whereby carriers in the MQW layer are uniformly distributed.

In addition, because of the two effects in the seventh embodiment, the carrier distribution in the MQW layer is more uniform, whereby a laser having a wide modulation bandwidth for high speed modulation is obtained.

Embodiments 8 and 9

Figure 12:
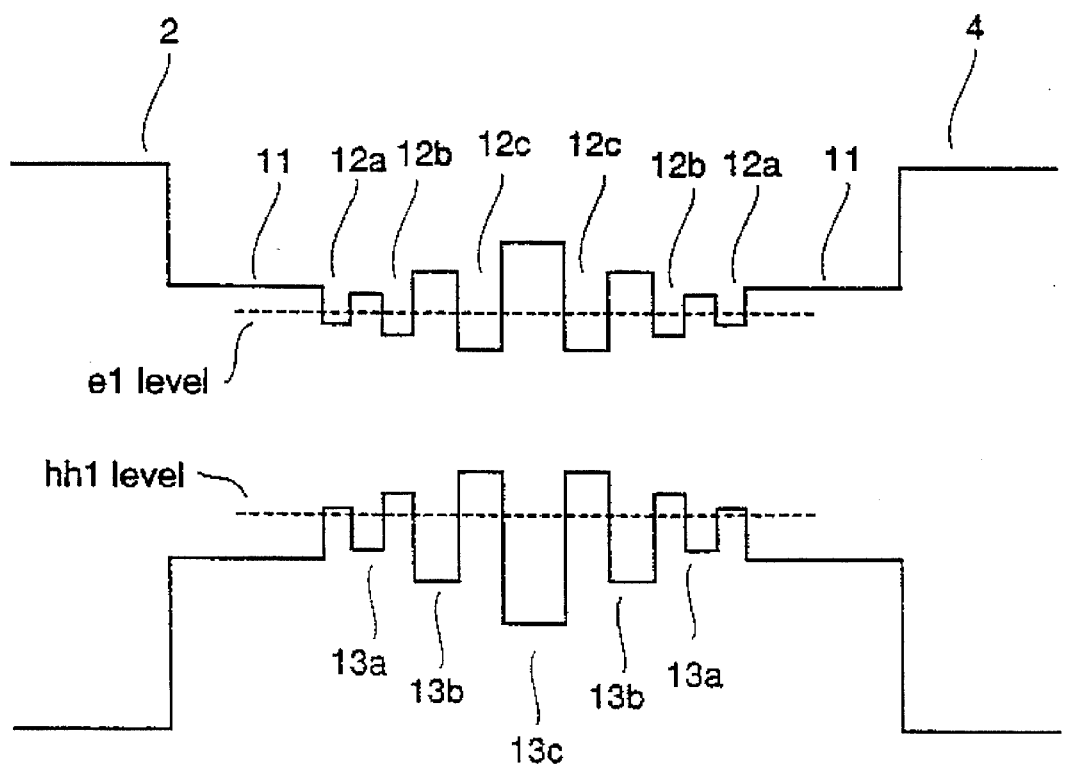
FIGS. 12(a)–12(b) are energy band diagrams of MQW active layers of semiconductor laser devices according to eighth and ninth embodiments of the present invention.
Figure 12:
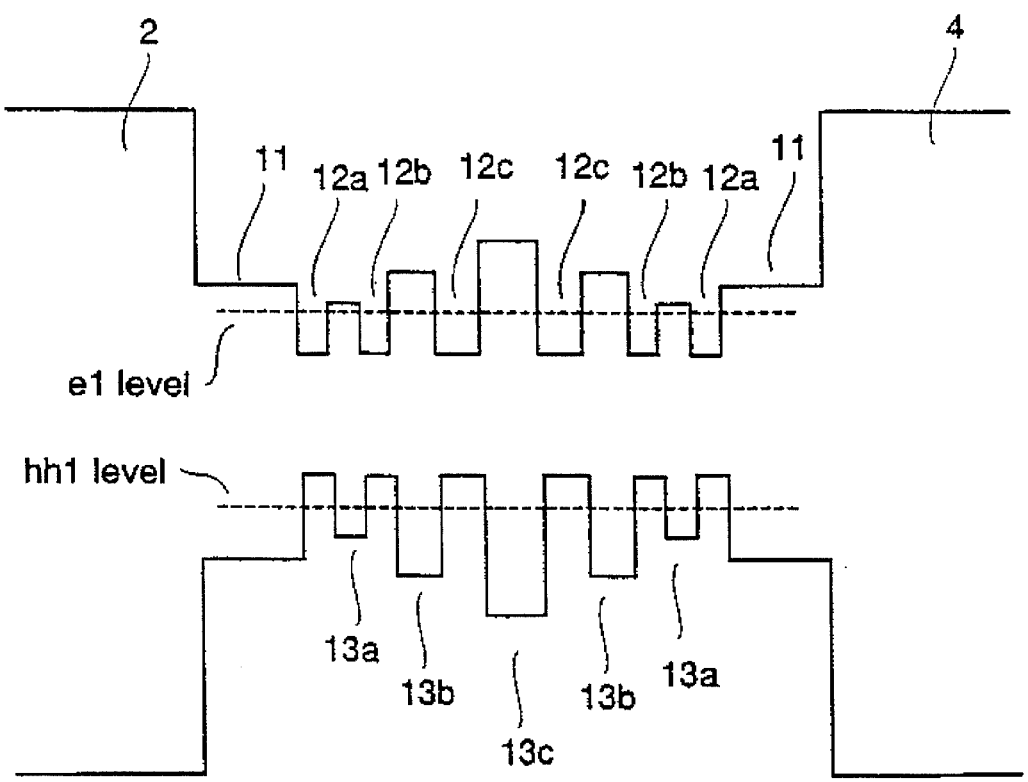

FIGS. 12(a) and 12(b) are energy band diagrams of MQW active layers of semiconductor laser devices according to eighth and ninth embodiments of the present invention.

TABLE 8

Embodiment 8

| Layer | x | y | Eg (eV) | Thickness (A) |
|---|---|---|---|---|
| 12a | 0.44 | 0.94 | 0.78 | 70 |
| 12b | 0.46 | 0.98 | 0.76 | 70 |
| 12c | 0.47 | 1.0 | 0.74 | 70 |
| 13a | 0.37 | 0.80 | 0.85 | 30 |
| 13b | 0.33 | 0.71 | 0.90 | 60 |
| 13c | 0.29 | 0.62 | 0.95 | 100 |

TABLE 9

Embodiment 9

| Layer | x | y | Eg (eV) | Thickness (A) |
|---|---|---|---|---|
| 12a | 0.47 | 1.0 | 0.74 | 30 |
| 12b | 0.47 | 1.0 | 0.74 | 40 |
| 12c | 0.47 | 1.0 | 0.74 | 70 |
| 13a | 0.37 | 0.80 | 0.85 | 30 |
| 13b | 0.33 | 0.71 | 0.90 | 60 |
| 13c | 0.29 | 0.62 | 0.95 | 100 |

As can be seen from tables 8 and 9, according to the eighth and ninth embodiments, the band gap energies of the barrier layers are largest in the center of the MQW structure and gradually decrease toward both ends of the MQW structure, and the barrier layer thickness is largest in the center of the MQW structure and gradually decreases toward both ends of the MQW structure. In addition, according to the eighth embodiment, the band gap energies of the well layers are smallest in the center of the MQW structure and gradually increase toward both ends of the MQW structure. According to the ninth embodiment, the well layer thickness is largest in the center of the MQW structure and gradually decreases toward both ends of the MQW structure.

Thus, according to the semiconductor laser device of the eighth and ninth embodiments of the present invention, the band gap energies of the barrier layers are largest in the center of the MQW structure and gradually decrease toward both ends of the MQW structure as in the first and second embodiments of the present invention, and the barrier layer thicknesses are largest in the center of the MQW structure and gradually decrease toward both ends of the MQW structure as in the third embodiment of the present invention. In addition, according to the eighth embodiment, the band gap energies of the well layers are smallest in the center of the MQW structure and gradually increase toward both ends of the MQW structure. According to the ninth embodiment, the well layer thicknesses are largest in the center of the MQW structure and gradually decrease toward both ends of the MQW structure. Since the band gap energies of the barrier layer 13 are largest in the center of the MQW structure and gradually decrease toward both ends of the MQW structure according to the eighth and ninth embodiments, carriers are uniformly distributed. Consequently, emission efficiency is improved and the modulation bandwidth for high speed modulation is increased. In addition, since the barrier layer thickness is smaller at the side of the p type cladding layer 2, the tunneling time Tt at that part is shortened and the velocity of the carriers is increased, whereby emission efficiency is improved and modulation bandwidth for high speed modulation is increased.

Embodiments 10 and 11

In semiconductor laser devices according to tenth and eleventh embodiments of the present invention, the energy band diagrams of MQW active layers are the same as those shown in FIGS. 9(a) and 9(b), respectively. The composition, band gap energy, thickness, and lattice constant of each of the well layers and barrier layers are as shown in the following tables 10 and 11.

TABLE 10

Embodiment 10

|  | x | y | Eg (eV) | Thickness (angstrom) | Lattice Constant (angstrom) |
| --- | --- | --- | --- | --- | --- |
| 12a | 0.44 | 0.94 | 0.78 | 70 | 5.8696 |
| 12b | 0.46 | 0.98 | 0.76 | 70 | 5.8696 |
| 12c | 0.47 | 1.0 | 0.74 | 70 | 5.8696 |
| 13a | 0.57 | 0.96 | 0.85 | 100 | 5.8226 |
| 13b | 0.45 | 0.81 | 0.90 | 100 | 5.8403 |
| 13c | 0.34 | 0.67 | 0.95 | 100 | 5.8580 |

TABLE 11

Embodiment 11

|  | x | y | Eg (eV) | Thickness (angstrom) | Lattice Constant (angstrom) |
| --- | --- | --- | --- | --- | --- |
| 12a | 0.47 | 1.0 | 0.74 | 30 | 5.8696 |
| 12b | 0.47 | 1.0 | 0.74 | 40 | 5.8696 |
| 12c | 0.47 | 1.0 | 0.74 | 70 | 5.8696 |
| 13a | 0.57 | 0.96 | 0.85 | 100 | 5.8226 |
| 13b | 0.45 | 0.81 | 0.90 | 100 | 5.8403 |
| 13c | 0.34 | 0.67 | 0.95 | 100 | 5.8580 |

As can be seen from tables 10 and 11, according to the tenth and eleventh embodiments of the present invention, the band gap energies of the barrier layers are largest in the center of the MQW structure and gradually decrease toward both ends of the MQW structure, the lattice constants of the barrier layers are smaller than that of the substrate, are largest in the center of the MQW structure, and gradually decrease toward both ends of the MQW structure. In addition, according to the tenth embodiment, the band gap energies of the well layers are smallest in the center of the MQW structure, and gradually increase toward both ends of the MQW structure. In addition, according to the eleventh embodiment, the well layer thicknesses are largest in the center of the MQW structure and gradually decrease toward both ends of the MQW structure.

Thus, in a semiconductor laser device according to the tenth and eleventh embodiments of the present invention, the band gap energies of the barrier layers are largest in the center of the MQW structure and gradually decrease toward both ends of the MQW structure, as in the first and second embodiments of the present invention. The lattice constants of the barrier layers are smaller than that of the substrate, are largest in the center of the MQW structure, and gradually decrease toward both ends of the MQW structure, as in the fourth embodiment of the present invention. In addition, according to the tenth embodiment, the band gap energies of the well layers are smallest in the center of the MQW structure and gradually increase toward both ends of the MQW structure. According to the eleventh embodiment, the well layer thicknesses are largest in the center of the MQW structure and gradually decrease toward both ends of the MQW structure. As a result, according to the tenth and eleventh embodiments, since the band gap energies of the barrier layers 13 are largest in the center of the MQW structure and gradually decrease toward both ends of the MQW structure, carriers are uniformly distributed, whereby emission efficiency is improved and the modulation bandwidth for high speed modulation is increased. In addition, the lattice constants of the barrier layers are smaller than that of the substrate, are largest in the center of the MQW structure, and gradually decrease toward both ends of the MQW structure. Therefore, the tensile strain of the barrier layers 13 at the p type cladding layer 2 is increased, whereby the effective mass of the holes in the barrier layers is decreased and the effective barrier height EB is decreased. Consequently, the tunneling time Tt and the thermal electron emission time Te are shortened and the velocity of the carriers is increased. Thus, emission efficiency is improved and the modulation bandwidth for high speed modulation is increased.

Embodiment 12

In a semiconductor laser device according to a twelfth embodiment of the present invention, the energy band diagram of an MQW active layer is the same as shown in FIG. 10. The composition, band gap energy, thickness, and lattice constant of each of layers is shown in the following table 12.

TABLE 12

Embodiment 12

|  | x | y | Eg (eV) | Thickness (angstrom) | Lattice Constant (angstrom) |
| --- | --- | --- | --- | --- | --- |
| 12 | 0.47 | 1.0 | 0.74 | 70 | 5.8696 |
| 13m | 0.51 | 0.85 | 0.95 | 30 | 5.8226 |
| 13n | 0.42 | 0.76 | 0.95 | 60 | 5.8403 |
| 13p | 0.34 | 0.68 | 0.95 | 100 | 5.8580 |

As can be seen from table 12, the thicknesses of the barrier layers are largest in the center of the MQW structure and gradually decrease toward both ends of the MQW structure. In addition, the lattice constants of the barrier layers are smaller than that of a substrate, are largest in the center of the MQW structure, and gradually decrease toward both ends of the MQW structure.

Thus, in a semiconductor laser device according to the twelfth embodiment of the present invention, the band gap energies of the barrier layers are largest in the center of the MQW structure and gradually decrease toward both ends of the MQW structure, as in the first and second embodiments of the present invention. The lattice constants of the barrier layers are smaller than that of the substrate, are largest in the center of the MQW structure, and gradually decrease toward both ends of the MQW structure, as in the fourth embodiment of the present invention. In addition, according to the tenth embodiment, the band gap energies of the well layers are smallest in the center of the MQW structure and gradually increase toward both ends of the MQW structure. According to the eleventh embodiment, the well layer thicknesses are largest in the center of the MQW structure and gradually decrease toward both ends of the MQW structure. As a result, according to the tenth and eleventh embodiments, since the band gap energies of the barrier layers 13 are largest in the center of the MQW structure and gradually decrease toward both ends of the MQW structure, carriers are uniformly distributed, so that emission efficiency is improved and modulation bandwidth for high speed modulation is increased. In addition, since the lattice constants of the barrier layers are smaller than that of the substrate, are largest in the center of the MQW structure, and gradually decrease toward both ends of the MQW structure, the tensile strain of the barrier layers 13 at the p type cladding layer 2 is increased, whereby the effective mass of holes in the barrier layers is decreased and the effective barrier height EB is decreased. Consequently, the tunneling time Tt and the thermal electron emission time Te are shortened and the velocity of the carriers is increased. Thus, emission efficiency is improved and modulation bandwidth at the time of high speed modulation is increased.

What is claimed is:

1. In a semiconductor laser device, an active layer having opposed interfaces with other layers of the semiconductor laser device and a multiquantum well (MQW) structure comprising a plurality of well layers, each well layer having a respective first band gap energy, and a plurality of barrier layers, each barrier layer having a respective second band gap energy larger than the first band gap energies, wherein each of the well layers is disposed between a pair of said barrier layers, each of said barrier layers has a respective thickness, and the thicknesses of said barrier layers gradually decrease from a largest value in a central part of the MQW structure toward the interfaces.

2. In a semiconductor laser device, an active layer having opposed interfaces with other layers of the semiconductor layer device and a multiquantum well (MQW) structure comprising a plurality of well layers, each well layer having a respective first band gap energy and a plurality of barrier layers, each barrier layer having a respective second band gap energy larger than the first band gap energies, wherein each of the well layers is disposed between a pair of said barrier layers, each of said barrier layers has a respective lattice constant smaller than a lattice constant of a substrate on which said semiconductor laser is disposed, and the lattice constant of said barrier layers is largest in a central par of the MQW structure and gradually decreases toward the interfaces.

3. In a semiconductor laser device, an active layer having opposed interfaces with other layers of the semiconductor laser device and a multiquantum well (MQW) structure comprising a plurality of well layers, each well layer having a respective first band gap energy, and a plurality of barrier layers, each barrier layer having a respective second band gap energy larger than the first band gap energies, wherein each of the well layers is disposed between a pair of said barrier layers, each of said barrier layers has a respective thickness, the thicknesses of said barrier layers gradually decreasing from a largest value in a central part of the MQW structure toward the interfaces, and a lattice constant smaller than a lattice constant of a substrate on which the semiconductor laser is disposed.

4. In a semiconductor laser device, an active layer having opposed interfaces with other layers of the semiconductor laser device and a multi-quantum well (MQW) structure comprising a plurality of well layers, each well layer having a respective first band gap energy, and a plurality of barrier layers, each barrier layer having a respective second band gap energy larger than the first band gap energies, wherein each of said well layers is disposed between a pair of said barrier layers, said second band gap energy varies within the MQW structure, has a largest value in a central part of the MQW structure, and gradually decreases toward the interfaces, and each of said barrier layers has a respective thickness that gradually decreases from a largest value in the central part of the MQW structure toward the interfaces.

5. In the semiconductor laser device of claim 4, the first band gap energy gradually increasing from a smallest value in the central part of the MQW structure toward the interfaces.

6. In the semiconductor laser device of claim 4 wherein each of said well layers has a respective thickness, the thickness of said well layers gradually decreasing from a largest value in the central part of the MQW structure toward the interfaces.

7. In a semiconductor laser device, an active layer having opposed interfaces with other layers of the semiconductor laser device and a multi-quantum well (MQW) structure comprising a plurality of well layers, each well layer having a respective first band gap energy, and a plurality of barrier layers, each barrier layer having a respective second band gap energy larger than the first band gap energies, wherein each of said well layers is disposed between a pair of said barrier layers, said second band gap energy varies within the MQW structure, has a largest value in a central part of the MQW structure, and gradually decreases toward the interfaces, and said barrier layers have respective lattice constants smaller than a lattice constant of a substrate on which said semiconductor laser is disposed gradually decreasing from a largest value in the central part of the MQW structure toward the interfaces.

8. In the semiconductor laser device of claim 7, the first band gap energy gradually increasing from a smallest value in the central part of the MQW structure toward the interfaces.

9. In the semiconductor laser device of claim 7 wherein each of said well layers has a respective thickness the thickness of said well layers gradually decreasing from a largest value in the central part of the MQW structure toward the interfaces.

10. In a semiconductor laser device, an active layer having opposed interfaces with other layers of the semiconductor laser device and a multi-quantum well (MQW) structure comprising a plurality of well layers each well layer having a respective first band gap energy, and a plurality of barrier layers, each barrier layer having a respective second band gap energy larger than the first band gap energies, wherein each of said well layers is disposed between a pair of said barrier layers, said barrier layers having respective thicknesses that vary within the MQW structure from a largest value in a central part of the MQW structure gradually decreasing toward the interfaces, and respective lattice constants smaller than a lattice constant of a substrate on which said semiconductor laser is disposed gradually decreasing from a largest value in the central part of the MQW structure toward the interfaces.

11. In the semiconductor laser device according to claim 1, a p type InP substrate;

a p type InP lower cladding layer disposed on said p type InP substrate, said active layer having a multi-quantum well (MQW) structure being disposed on said p type lower cladding layer at one of the interfaces;

an n type upper cladding layer disposed on the MQW active layer at another of the interfaces;

p type and n type current blocking layers disposed on both sides of a mesa including said p type lower cladding layer, said MQW active layer, and said n type cladding layer;

a p side electrode disposed on the rear side of said p type InP substrate; and an n side electrode disposed on said n type InP upper cladding layer.

12. In the semiconductor laser device according to claim 2, a p type InP substrate;

a p type InP lower cladding layer disposed on said p type InP substrate, said active layer having a multi-quantum well (MQW) structure being disposed on said p type lower cladding layer at one of the interfaces;

an n type upper cladding layer disposed on the MQW active layer at another of the interfaces;

p type and n type current blocking layers disposed on both sides of a mesa including said p type lower cladding layer, said MQW active layer, and said n type cladding layer;

a p side electrode disposed on the rear side of said p type InP substrate; and an n side electrode disposed on said n type InP upper cladding layer.

13. In the semiconductor laser device according to claim 3, a p type InP substrate;

a p type InP lower cladding layer disposed on said p type InP substrate, said active layer having a multi-quantum well (MQW) structure being disposed on said p type lower cladding layer at one of the interfaces;

an n type upper cladding layer disposed on the MQW active layer at another of the interfaces;

p type and n type current blocking layers disposed on both sides of a mesa including said p type lower cladding layer, said MQW active layer, and said n type cladding layer;

a p side electrode disposed on the rear side of said p type InP substrate; and an n side electrode disposed on said n type InP upper cladding layer.

14. In the semiconductor laser device according to claim 4, a p type InP substrate;

a p type InP lower cladding layer disposed on said p type InP substrate, said active layer having a multi-quantum well (MQW) structure being disposed on said p type lower cladding layer at one of the interfaces;

an n type upper cladding layer disposed on the MQW active layer at another of the interfaces;

p type and n type current blocking layers disposed on both sides of a mesa including said p type lower cladding layer, said MQW active layer, and said n type cladding layer;

a p side electrode disposed on the rear side of said p type InP substrate; and an n side electrode disposed on said n type InP upper cladding layer.

15. In the semiconductor laser device according to claim 7, a p type InP substrate;

a p type InP lower cladding layer disposed on said p type InP substrate, said active layer having a multi-quantum well (MQW) structure being disposed on said p type lower cladding layer at one of the interfaces;

an n type upper cladding layer disposed on the MQW active layer at another of the interfaces;

p type and n type current blocking layers disposed on both sides of a mesa including said p type lower cladding layer, said MQW active layer, and said n type cladding layer;

a p side electrode disposed on the rear side of said p type InP substrate; and an n side electrode disposed on said n type InP upper cladding layer.

16. In the semiconductor laser device according to claim 10, a p type InP substrate;

a p type InP lower cladding layer disposed on said p type InP substrate, said active layer having a multi-quantum well (MQW) structure being disposed on said p type lower cladding layer at one of the interfaces;

an n type upper cladding layer disposed on the MQW active layer at another of the interfaces;

p type and n type current blocking layers disposed on both sides of a mesa including said p type lower cladding layer, said MQW active layer, and said n type cladding layer;

a p side electrode disposed on the rear side of said p type InP substrate; and an n side electrode disposed on said n type InP upper cladding layer.

* * * * *

UNITED STATES PATENT AND TRADEMARK OFFICE
CERTIFICATE OF CORRECTION

PATENT NO. : 5,544,188
DATED : August 6, 1996
INVENTOR(S) : Takiguchi et al.

It is certified that error appears in the above-indentified patent and that said Letters Patent is hereby corrected as shown below:

On the title page, item [56], References Cited: U.S. Patent Documents; change "63-06686" to --63-306686--;

Column 15, Line 19, change "layer" to --laser--;

Line 21, after "energy" insert --,--;

Line 28, change "par" to --part--;

Column 16, Line 22, after "thickness" insert --,--;

Line 28, after "layers" insert --,--.

Signed and Sealed this

Fourth Day of February, 1997

Attest:

BRUCE LEHMAN

*Attesting Officer*     *Commissioner of Patents and Trademarks*